US009530676B2

(12) United States Patent
Yokoyama et al.

(10) Patent No.: US 9,530,676 B2
(45) Date of Patent: Dec. 27, 2016

(54) SUBSTRATE PROCESSING APPARATUS, SUBSTRATE TRANSFER METHOD AND SUBSTRATE TRANSFER DEVICE

(75) Inventors: Toshio Yokoyama, Tokyo (JP); Junji Kunisawa, Tokyo (JP); Mitsuru Miyazaki, Tokyo (JP); Kenichi Suzuki, Tokyo (JP); Hiroshi Sotozaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 181 days.

(21) Appl. No.: 13/483,118

(22) Filed: May 30, 2012

(65) Prior Publication Data
US 2012/0308356 A1   Dec. 6, 2012

(30) Foreign Application Priority Data

Jun. 1, 2011 (JP) ................................. 2011-123369
Aug. 9, 2011 (JP) ................................. 2011-173704

(51) Int. Cl.
*H01L 21/67* (2006.01)
*H01L 21/677* (2006.01)
*H01L 21/687* (2006.01)
*B25J 11/00* (2006.01)

(52) U.S. Cl.
CPC ...... *H01L 21/67718* (2013.01); *B25J 11/0095* (2013.01); *H01L 21/6704* (2013.01);
(Continued)

(58) Field of Classification Search
CPC .................... H01L 21/67173; H01L 21/67161; H01L 21/67184; H01L 21/6719; H01L 21/67196; H01L 21/67745; H01L 21/67748; H01L 21/67754; H01L 21/02628; H01L 21/6704; H01L 21/67393; H01L 21/67772
(Continued)

(56) References Cited

U.S. PATENT DOCUMENTS 5,893,794 A    4/1999   Togawa et al.
6,376,345 B1   4/2002   Ohashi et al.
(Continued)

FOREIGN PATENT DOCUMENTS

JP    10-177999    6/1998
JP    11-251317    9/1999
(Continued)

OTHER PUBLICATIONS

English Machine Translation of Description of JP2004327519 (Toshio et al., 2004).*

*Primary Examiner* — Joseph L Perrin
*Assistant Examiner* — Irina Graf
(74) *Attorney, Agent, or Firm* — Wenderoth, Lind, Ponack, L.L.P.

(57) ABSTRACT

A substrate processing apparatus can prevent photo-corrosion of, e.g., copper interconnects due to exposure of a surface to be processed of a substrate to light, and can perform processing, such as cleaning, of a substrate surface while preventing photo-corrosion of, e.g., copper interconnects due to exposure to light. The substrate processing apparatus includes a plurality of processing areas housing therein processing units which have been subjected to light shielding processing; and at least one transfer area housing therein a transfer robot and disposed between two adjacent ones of the plurality of processing areas. A light shielding wall is provided between the transfer area and each of the two adjacent processing areas, and a light-shielding maintenance door is provided for the front opening of the transfer area. The processing units are coupled to the light shielding walls in a light-shielding manner.

9 Claims, 10 Drawing Sheets

(52) U.S. Cl.
CPC .. *H01L 21/67173* (2013.01); *H01L 21/67196* (2013.01); *H01L 21/67219* (2013.01); *H01L 21/67706* (2013.01); *H01L 21/67742* (2013.01); *H01L 21/68707* (2013.01)

(58) Field of Classification Search
USPC ...... 134/902, 1.2, 133; 414/153, 219, 749.1, 414/935; 118/500
See application file for complete search history.

(56) References Cited

U.S. PATENT DOCUMENTS

| | | | |
|---|---|---|---|
| 6,672,779 B2* | 1/2004 | Ueda | G07C 9/00103 118/319 |
| 7,815,558 B2* | 10/2010 | Tajiri et al. | 483/4 |
| 2002/0179127 A1* | 12/2002 | Ohkura | H01L 21/67017 134/61 |
| 2004/0060582 A1* | 4/2004 | Sasaki | H01L 21/6708 134/61 |
| 2005/0279281 A1* | 12/2005 | Yamashita | H01L 21/67126 118/719 |
| 2009/0186557 A1* | 7/2009 | Torii | H01L 21/67751 451/8 |
| 2009/0209175 A1 | 8/2009 | Saito et al. | |
| 2009/0305612 A1* | 12/2009 | Miyazaki et al. | 451/11 |

FOREIGN PATENT DOCUMENTS

| | | |
|---|---|---|
| JP | 2004-63589 | 2/2004 |
| JP | 2004-327519 | 11/2004 |
| JP | 2006-35328 | 2/2006 |
| JP | 2010-50436 | 3/2010 |

* cited by examiner

SUBSTRATE PROCESSING APPARATUS, SUBSTRATE TRANSFER METHOD AND SUBSTRATE TRANSFER DEVICE

CROSS-REFERENCE TO RELATED APPLICATIONS

This document claims priorities to Japanese Application Number 2011-123369, filed Jun. 1, 2011 and Japanese Application Number 2011-173704, filed Aug. 9, 2011, the entire contents of which are hereby incorporated by reference.

BACKGROUND OF THE INVENTION

Field of the Invention

The present invention relates to a substrate processing apparatus, and more particularly to a substrate processing apparatus which can perform processing, such as cleaning, of a surface (surface to be processed) of a substrate, such as a semiconductor wafer, while preventing photo-corrosion of, e.g., copper interconnects, formed in the surface of the substrate, due to exposure of the interconnects to light.

The present invention also relates to a substrate transfer method for transferring a substrate and a substrate transfer device, and more particularly to a substrate transfer method for transferring a substrate in a substrate processing apparatus and to a substrate transfer device provided in a substrate processing apparatus.

Description of the Related Art

Because of the advantages of low interconnect resistance, etc., copper is commonly used these days as an interconnect material in an electronic circuit substrate. Copper interconnects, which use copper as an interconnect material, are generally formed by carrying out copper plating of a surface of a substrate in which interconnect trenches and vias are formed, and then carrying out chemical mechanical polishing (CMP) of the substrate surface to remove an unnecessary portion of the copper plated film formed, i.e., a portion other than the copper plated film embedded in the interconnect trenches and vias.

Copper is generally weak against corrosion. Therefore, for copper interconnects formed in a substrate surface, a countermeasure against copper corrosion should be taken even during processing, such as cleaning, of the substrate surface. A copper corrosion phenomenon, called photo-corrosion, is known which occurs by the photovoltaic effect. The photo-corrosion of copper is caused when copper is exposed to light (e.g., illumination light in a clean room).

Therefore, the applicant has proposed various substrate processing apparatuses designed to prevent photo-corrosion of, e.g., copper interconnects due to exposure of a surface (surface to be processed) of a substrate to light (see Patent literatures 1 to 3). The applicant has also proposed a substrate processing apparatus which, in order to achieve a high throughput, includes a cleaning section having a plurality of cleaning lines for cleaning a plurality of substrates (see Patent literature 4).

A substrate transfer device for transferring a substrate between processing units is indispensable to a substrate processing apparatus which performs processing, such as polishing or cleaning, of a substrate. There are a variety of types of known substrate transfer devices. Among them is a widely-used substrate transfer device which has a mechanism for gripping a peripheral portion of a substrate (see Patent literatures 4 and 5).

CITATION LIST

Patent Literature

Patent literature 1: Japanese Patent Laid-Open Publication No. 2004-63589
Patent literature 2: Japanese Patent Laid-Open Publication No. 2004-327519
Patent literature 3: Japanese Patent Laid-Open Publication No. 2006-35328
Patent literature 4: Japanese Patent Laid-Open Publication No. 2010-50436
Patent literature 5: Japanese Patent Laid-Open Publication No. H10-177999

SUMMARY OF THE INVENTION

Maintenance work is important for a substrate processing apparatus to maintain its performance. The substrate processing apparatus is usually stopped when carrying out maintenance work for the apparatus. A maintenance door of the processing apparatus needs to be opened upon maintenance work. When the maintenance door is opened, light will enter the apparatus and may cause photo-corrosion of, e.g., copper interconnects exposed on a surface (surface to be processed) of a substrate. Processing, such as cleaning, of a substrate must therefore be stopped during maintenance work.

It is necessary to make an adjustment in positioning (teaching operation) between a substrate transfer device and a substrate support provided in a processing unit so that the substrate transfer device can perform predetermined substrate transfer operations. If the positioning adjustment is insufficient, it is possible that friction may occur between a substrate and the substrate support, causing damage to the substrate and generating particles. Further, in some cases, a substrate cannot be transferred from a certain place to a certain other place. A high-accuracy positioning adjustment is therefore required for a substrate transfer device in order to avoid such problems.

The present invention has been made in view of the above situation. It is therefore a first object of the present invention to provide a substrate processing apparatus which can prevent photo-corrosion of, e.g., copper interconnects due to exposure of a surface to be processed of a substrate to light and, even during maintenance work on a processing unit in the apparatus, can perform processing, such as cleaning, of a substrate surface while preventing photo-corrosion of, e.g., copper interconnects due to exposure to light, though the number of processable substrates decreases during the maintenance work.

It is a second object of the present invention to provide a substrate transfer method and a substrate transfer device which can broaden the acceptable range of positioning adjustment for a substrate transfer device and can prevent damage to a substrate, the generation of particles and a substrate transfer failure.

The present invention provides a substrate processing apparatus comprising: a plurality of processing areas housing therein processing units which have been subjected to light shielding processing; and at least one transfer area housing therein a transfer robot and disposed between two adjacent ones of the plurality of processing areas, wherein a light shielding wall is provided between the transfer area and each of the two adjacent processing areas, and a light-shielding maintenance door is provided for the front opening of the transfer area, and wherein the processing units are coupled to the light shielding walls in a light-shielding manner.

By thus using the processing units which have been subjected to light shielding processing, providing the light shielding wall between the transfer area and each of the two adjacent processing areas and providing the light-shielding maintenance door for the front opening of the transfer area, external light can be prevented from entering the transfer area even when a maintenance door for a processing unit is open.

In a preferred aspect of the present invention, a plurality of vertically-arranged processing units are housed in each processing area.

Even during maintenance work on, e.g., the upper processing unit of two vertically-arranged processing units, processing of a substrate can be performed in a light-shielded environment in the lower processing unit. Thus, even during maintenance work on a processing unit, processing of a substrate can be carried out by using the other processing units without stopping the apparatus.

In a preferred aspect of the present invention, the processing units each have a substrate insertion opening provided with an openable/closable shutter; a light shielding film, surrounding the periphery of the substrate insertion opening, is provided in each of the light shielding walls; and the light shielding walls each have an opening in an area surrounded by the light shielding film.

When the shutter of a processing unit is open, a substrate can be transferred to or from the processing unit while keeping the interiors of the processing unit and the transfer area in a light-shielded environment. By closing the shutter of the processing unit, external light can be prevented from entering the transfer area through the opening of the light shielding wall, e.g., during maintenance work on the processing unit.

In a preferred aspect of the present invention, the substrate insertion opening is provided on the transfer area-facing side of the processing unit.

In a preferred aspect of the present invention, the processing areas are cleaning areas, and the substrate processing apparatus is a substrate cleaning apparatus.

The present invention also provides a substrate transfer method comprising the steps of supporting the periphery of a substrate by a pair of support arms with a predetermined clearance formed between each support arm and a peripheral end portion of the substrate; and moving the support arms and the substrate by a movement mechanism.

In a preferred aspect of the present invention, the substrate transfer method further comprises the step of reversing the substrate.

The present invention also provides a substrate transfer device comprising a pair of support arms each for supporting a peripheral end portion of a substrate; an opening/closing mechanism for moving the support arms away from and closer to each other; and a movement mechanism coupled to the opening/closing mechanism. The opening/closing mechanism moves the support arms closer to each other until a predetermined clearance is formed between each support arm and the peripheral end portion of the substrate, and the movement mechanism moves the support arms and the substrate while maintaining the predetermined clearance.

In a preferred aspect of the present invention, the substrate transfer device further comprises a reversing mechanism for reversing the substrate.

In a preferred aspect of the present invention, the substrate transfer device further comprises a substrate detector for detecting the presence or absence of the substrate.

The substrate processing apparatus of the present invention can prevent photo-corrosion of, e.g., copper interconnects due to exposure of a surface to be processed of a substrate to light and, even during maintenance work on a processing unit in the apparatus, can perform processing, such as cleaning, of a substrate surface while preventing photo-corrosion of, e.g., copper interconnects due to exposure to light, though the number of processable substrates decreases temporarily during the maintenance work.

According to the substrate transfer method and the substrate transfer device of the present invention, the clearance permits lateral movement of a substrate when it is placed on a substrate support (e.g., a temporary holder), and therefore the substrate and the substrate support will not strongly rub together. This can prevent damage to the substrate, the generation of particles, and a failure in transfer of the substrate.

DETAILED DESCRIPTION OF THE PREFERRED EMBODIMENTS

Preferred embodiments of the present invention will now be described in detail with reference to the drawings. The following description illustrates an exemplary case in which a substrate processing apparatus according to the present invention is applied to a cleaning section provided in a CMP (chemical mechanical polishing) apparatus which removes an unnecessary portion of a copper plated film formed on a surface of a substrate, such as a semiconductor wafer, i.e. a portion other than a copper plated film embedded in interconnect trenches and vias, thereby forming copper interconnects.

A substrate processing apparatus according to the present invention can, of course, be applied to a cleaning section of an apparatus different from a CMP apparatus or to a processing section different from a cleaning section if such a cleaning section or processing section is required to prevent photo-corrosion due to exposure to light.

Figure 1:
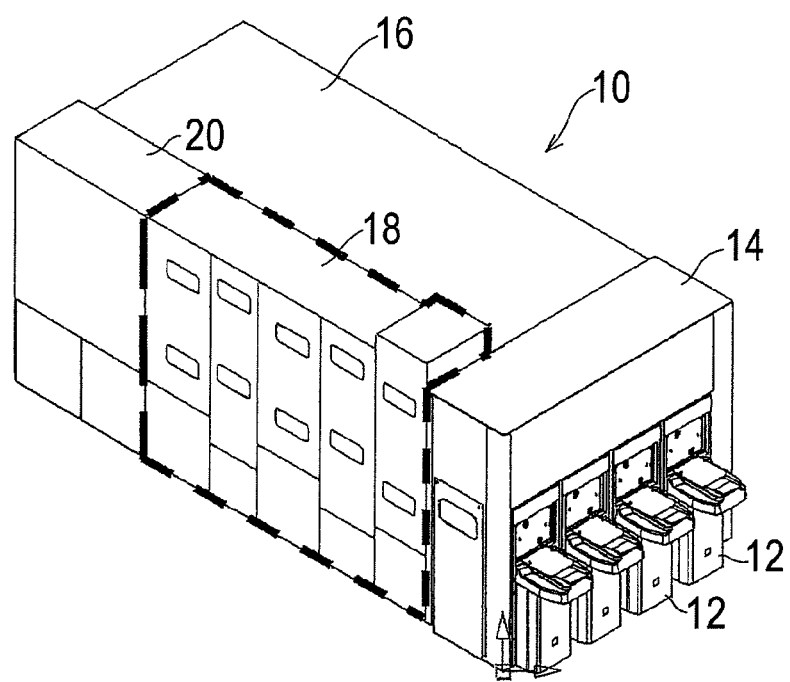
FIG. 1 is an overall external view of a CMP apparatus having a cleaning section which is a substrate processing apparatus according to the present invention.

FIG. 1 shows an overall external view of a CMP apparatus having a cleaning section which is a substrate processing apparatus according to the present invention. As shown in FIG. 1, the CMP apparatus includes a generally-rectangular housing 10 whose interior is dark, and a plurality (e.g., four as illustrated) of front loading sections 12, disposed adjacent to the housing 10, each for placing thereon a substrate cassette for housing a large number of substrates, such as semiconductor wafers. The interior of the housing 10 is divided by partition walls 1a, 1b (see FIG. 8) into a loading/unloading section 14, a polishing section 16 housing polishing units each for polishing a surface (surface to be polished) of a substrate, and a cleaning section (substrate processing apparatus) 18 for cleaning a surface of a substrate after polishing. The loading/unloading section 14, the polishing section 16 and the cleaning section 18 have been assembled independently and can be evacuated independently. The CMP apparatus also includes a control section 20 for controlling substrate processing operations.

Figure 2:
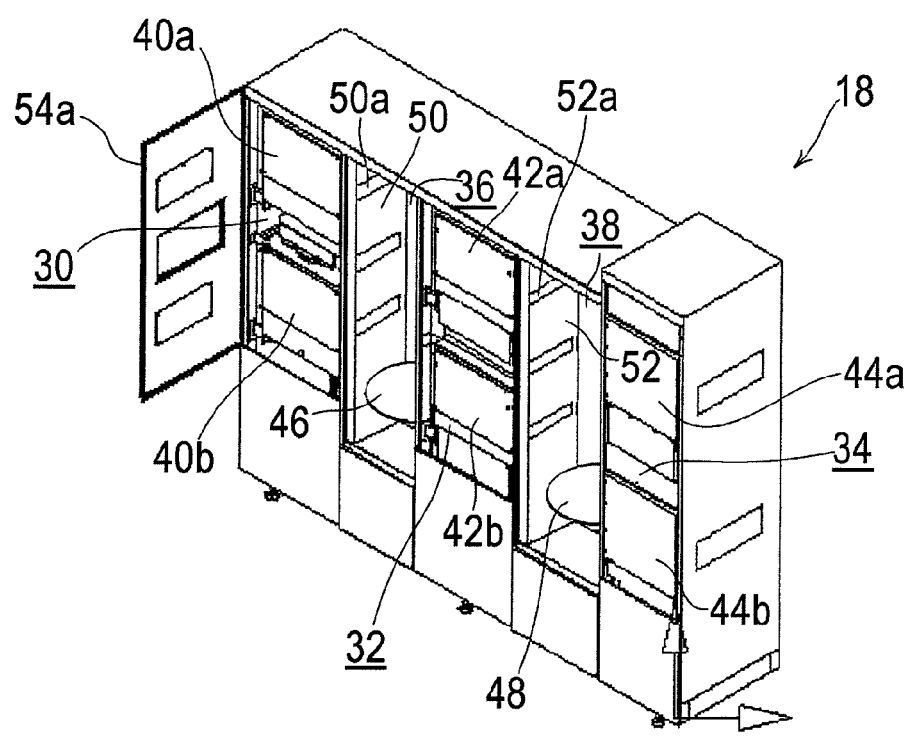
FIG. 2 is an external view of the cleaning section, illustrating the cleaning section when a maintenance door, provided for the front opening of a first cleaning area, is open and the other maintenance doors of the cleaning section are omitted.
Figure 3:
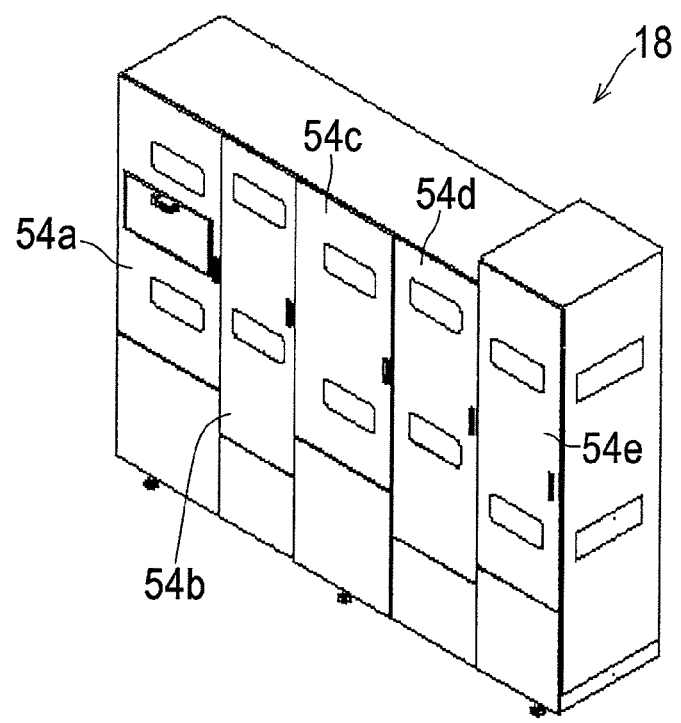
FIG. 3 is an external view of the cleaning section, illustrating the cleaning section when all the maintenance doors are closed.
Figure 4:
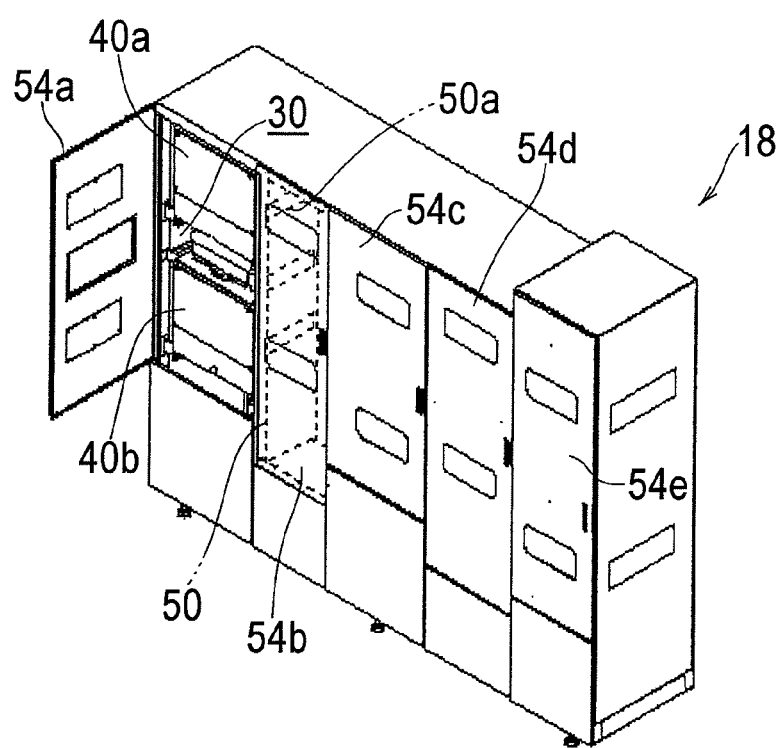
FIG. 4 is an external view of the cleaning section, illustrating the cleaning section when the maintenance door, provided for the front opening of the first cleaning area, is open and the other maintenance doors of the cleaning section are all closed.

FIG. 2 is an external view of the cleaning section 18, illustrating the cleaning section 18 when a maintenance door 54a, provided for the front opening of a first cleaning area 30, is open and the other maintenance doors of the cleaning section are omitted. FIG. 3 is an external view of the cleaning section 18, illustrating the cleaning section 18 when all the maintenance doors 54a-54e are closed. FIG. 4 is an external view of the cleaning section 18, illustrating the cleaning section 18 when the maintenance door 54a, provided for the front opening of the first cleaning area 30, is open and the other maintenance doors 54b-54e of the cleaning section 18 are all closed. The front openings of cleaning areas face the outside of the substrate processing apparatus.

As shown in FIG. 2, the cleaning section 18 of this embodiment has three cleaning areas (processing areas), a first cleaning area 30, a second cleaning area 32 and a third cleaning area 34. A transfer area is disposed between two adjacent cleaning areas. Thus, a first transfer area 36 is disposed between the first cleaning area 30 and the second cleaning area 32, and a second transfer area 38 is disposed between the second cleaning area 32 and the third cleaning area 34. The number of cleaning areas is arbitrary if it is plural.

First cleaning units 40a, 40b are arranged vertically and housed in the first cleaning area 30. Similarly, second cleaning units 42a, 42b are arranged vertically and housed in the second cleaning area 32, and third cleaning units 44a, 44b are arranged vertically and housed in the third cleaning area 34. On the other hand, a first transfer robot 46 is housed in the first transfer area 36 and a second transfer robot 48 is housed in the second transfer area 38.

A substrate, which has undergone polishing in the polishing section 16, is transferred by the first transfer robot 46 to one of the first cleaning units 40a, 40b, where the substrate is cleaned (primary cleaning). The substrate cleaned by one of the first cleaning units 40a, 40b is transferred by the first transfer robot 46 to one of the second cleaning units 42a, 42b, where the substrate is cleaned (secondary cleaning). The substrate cleaned by one of the second cleaning units 42a, 42b is transferred by the second transfer robot 48 to one of the third cleaning units 44a, 44b, where the substrate is cleaned (rinsing and drying). Then, the substrate cleaned by one of the third cleaning units 44a, 44b is returned via the loading/unloading section 14 to the substrate cassette placed on the front loading section 12.

A light shielding wall 50, having openings 50a formed in predetermined positions, is disposed between the first cleaning area 30 and the first transfer area 36. Similarly, a light shielding wall 52, having openings 52a formed in predetermined positions, is disposed between the second cleaning area 32 and the second transfer area 38. Though not shown in FIG. 2, two light shielding walls, each having openings formed in predetermined portions, are provided also between the first transfer area 36 and the second cleaning area 32 and between the second transfer area 38 and the third cleaning area 34.

As shown in FIGS. 3 and 4, an openable/closable maintenance door is provided for the front opening of each area. Thus, an openable/closable maintenance door 54a is provided for the front opening of the first cleaning area 30. Similarly, an openable/closable maintenance door 54b is provided for the front opening of the first transfer area 36; an openable/closable maintenance door 54c is provided for the front opening of the second cleaning area 32; an openable/closable maintenance door 54d is provided for the front opening of the second transfer area 38; and an openable/closable maintenance door 54e is provided for the front opening of the third cleaning area 34.

The maintenance door 54b, provided for the front opening of the first transfer area 36, and the maintenance door 54d, provided for the front opening of the second transfer area 38, have been subjected to light shielding processing so that light will not enter the transfer areas 36, 38 from the front openings of the transfer areas 36, 38 when the maintenance doors 54b, 54d are closed.

Figure 5:
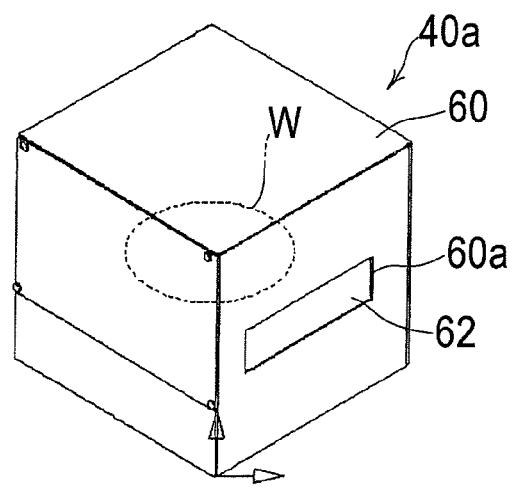
FIG. 5 is a perspective view of a first cleaning unit.

The first cleaning unit 40a, the upper one of the two cleaning units provided in the first cleaning area 30, and the light shielding wall 50, disposed between the first cleaning area 30 and the first transfer area 36, will now be described below with reference to FIGS. 5 through 7. FIG. 5 is a perspective view of the first cleaning unit 40a, FIG. 6 is a perspective view showing the relationship between the first cleaning unit 40a and the light shielding wall 50, and FIG. 7 is an enlarged view of a main portion of FIG. 6.

Figure 6:
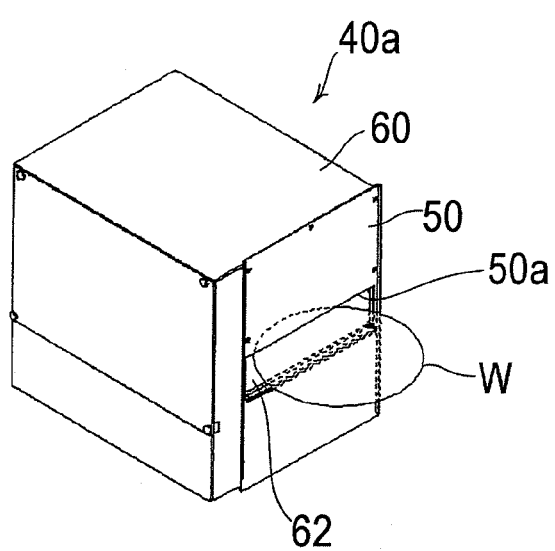
FIG. 6 is a perspective view showing the relationship between the first cleaning unit and a light shielding wall.
Figure 7:
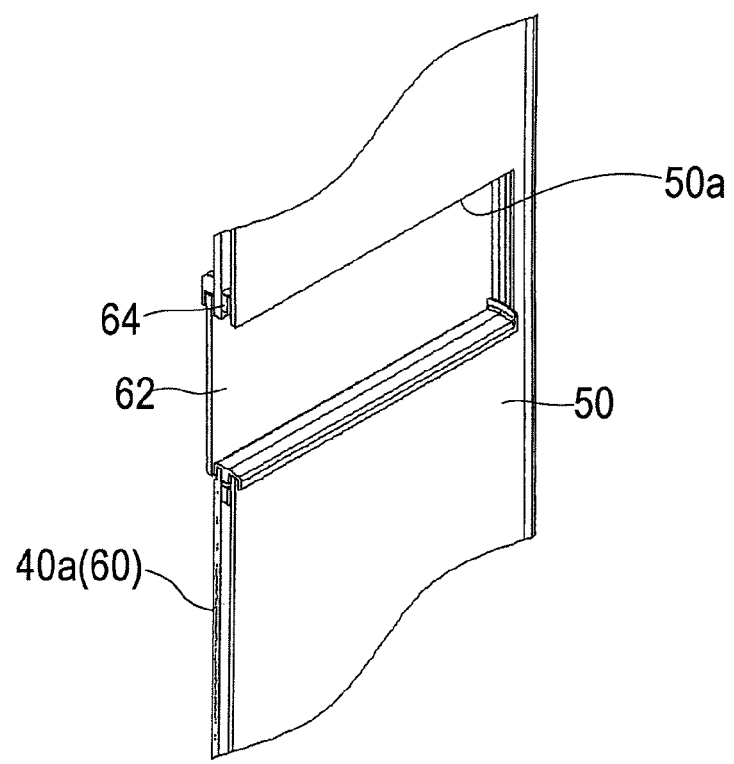
FIG. 7 is an enlarged view of a main portion of FIG. 6.

As shown in FIGS. 5 through 7, the first cleaning unit 40a includes a rectangular box-like housing 60 composed of a light shielding material (e.g., a colored resin). A cleaning machine (not shown) for cleaning a substrate W, as shown by the imaginary line in FIG. 5, is housed in the housing 60. A substrate insertion opening 60a for transfer of the substrate W is formed in the sidewall of the housing 60. An openable/closable shutter 62 for opening/closing the substrate insertion opening 60a is provided on the back side of the substrate insertion opening 60a. Thus, the interior of the housing 60 can be kept completely light-shielded by closing the shutter 62, while the substrate W can be carried into or out of the housing 60 by opening the shutter 62.

The above-described construction of the first cleaning unit 40a is the same with the other cleaning units 40b, 42a, 42b, 44a, 44b.

The first cleaning unit 40a is coupled to the light shielding wall 50 in a light-shielding manner. In particular, as shown in FIGS. 6 and 7, the opening 50a of the light shielding wall 50 has substantially the same shape as the substrate insertion opening 60a of the first cleaning unit 40a and is provided in a position facing the substrate insertion opening 60a. A rectangular frame-shaped light shielding film 64, e.g., of a packing, is mounted to the first cleaning unit 40a-facing surface of the light shielding wall 50 at a position surrounding the periphery of the opening 50a. The first cleaning unit 40a is coupled to the light shielding wall 50 with the side surface of the housing 60 in contact with the light shielding film 64. The periphery of the substrate insertion opening 60a of the housing 60 is thus surrounded by the light shielding film 64.

Such a constructional relationship between the first cleaning unit 40a and the light shielding wall 50 is the same with the relationship between any one of the other cleaning units 40b, 42a, 42b, 44; 44b and an adjacent one of the light shielding walls 50, 52.

In usual operation of the cleaning section 18, a substrate, which has undergone polishing in the polishing section 16, is carried into the cleaning section 18 and cleaned while all the maintenance doors 54a-54e are closed, as shown in FIG. 3. During cleaning of the substrate, the interiors of the first cleaning units 40a, 40b in the first cleaning area 30, the second cleaning units 42a, 42b in the second cleaning area 32, the third cleaning units 44a, 44b in the third cleaning area 34 and the first and second transfer areas 36, 38 are light-shielded. This makes it possible to carry out processing (cleaning) of a substrate surface while preventing photo-corrosion due to exposure of the substrate surface to light.

When carrying out maintenance work, e.g., for the upper first cleaning unit 40a of the first cleaning units 40; 40b vertically arranged in the first cleaning area 30, only the maintenance door 54a, provided for the front opening of the first cleaning area 30, is opened, as shown in FIG. 4. On the other hand, the substrate insertion opening 60a of the housing 60 of the first cleaning unit 40a is closed by the shutter 62 so that the shutter 62 constitutes part of the light shielding wall 50 and external light will not enter the first transfer area 36 through the substrate insertion opening 60a during maintenance work of the first cleaning unit 40a.

As with the first cleaning unit 40; the lower first cleaning unit 40b disposed in the first cleaning area 30 includes a rectangular box-like housing made of a light shielding material, and the periphery of the substrate insertion opening is surrounded by a light shielding film. Further, the light shielding wall 50 is disposed between the first cleaning area 30 and the first transfer area 36, and the maintenance door 54b for the front opening of the first transfer area 36 is closed. Accordingly, even when the maintenance door 54a for the front opening of the first cleaning area 30 is open, the interior of the first cleaning unit 40b and the interior of the first transfer area 36 are light-shielded, i.e. external light is prevented from entering the interiors.

This holds for the interiors of the second cleaning units 42; 42b in the second cleaning area 32 and the third cleaning units 44; 44b in the third cleaning area 34, and for the interior of the second transfer area 38.

Thus, even during maintenance work on the first cleaning unit 40a when the maintenance door 54a for the front opening of the first cleaning area 30 is open, a substrate can be processed (cleaned) in a light-shielded environment using the other cleaning unit 40b in the first cleaning area 30, the second cleaning units 42a, 42b in the second cleaning area 32, the third cleaning units 44a, 44b in the third cleaning area 34, the first transfer area 36 and the second transfer area 38.

The same holds for the case of carrying out maintenance work on the lower first cleaning unit 40b in the first cleaning area 30, one of the second cleaning units 42a, 42b in the second cleaning area 32, or one of the third cleaning units 44a, 44b in the third cleaning area 34.

As described above, according to the cleaning section of this embodiment, even during maintenance work on one cleaning unit, cleaning of a substrate can be performed in the other cleaning units, without stopping the apparatus, while preventing photo-corrosion due to exposure to light.

Figure 8:
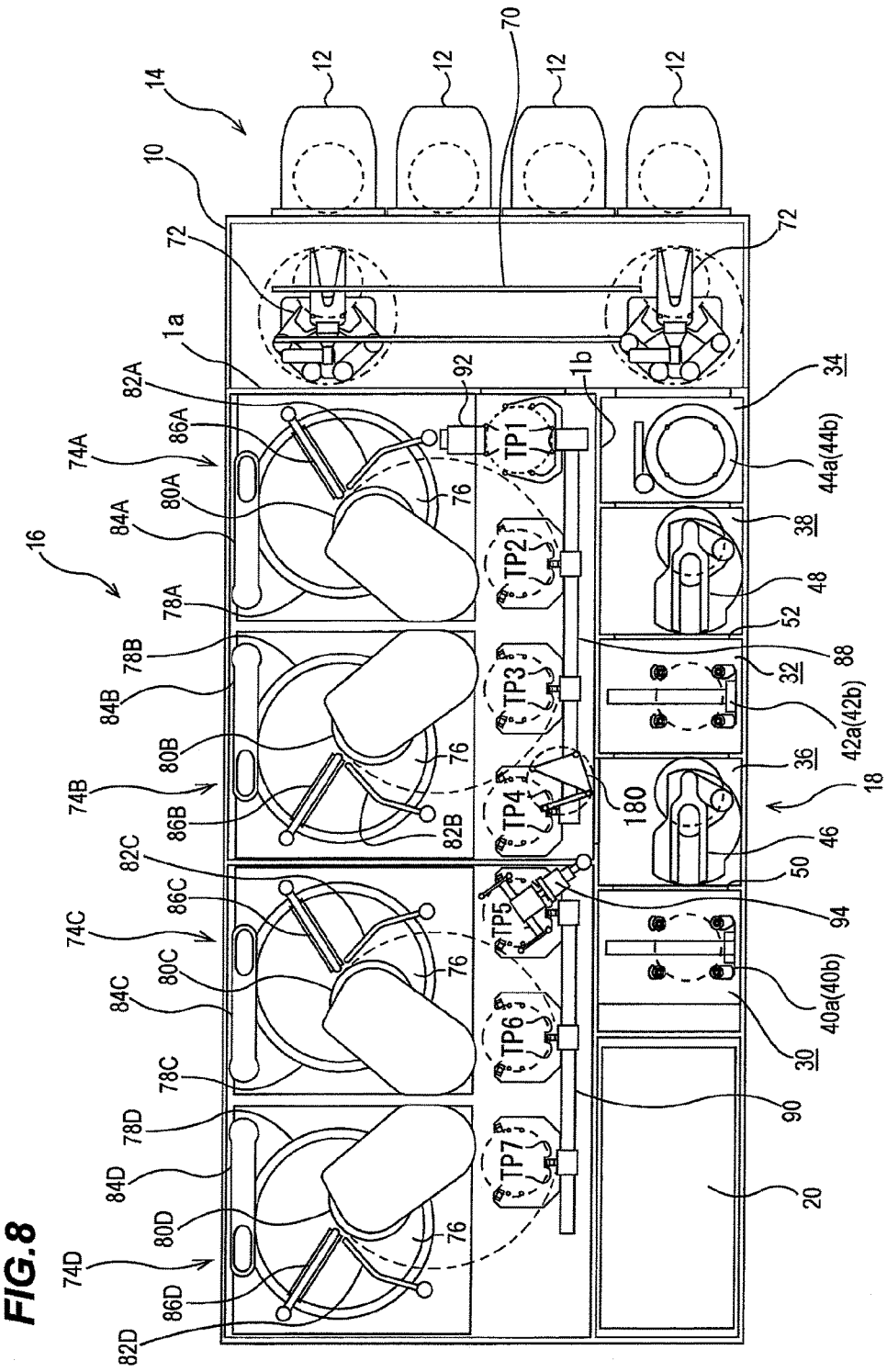
FIG. 8 is a layout plan view of the interior of the CMP apparatus shown in FIG. 1.

FIG. 8 is a layout plan view of the interior of the CMP apparatus shown in FIG. 1. As shown in FIG. 8, the interior of the housing 10 is divided by the partition walls 1a, 1b into the loading/unloading section 14, the polishing section 16 and the cleaning section (substrate processing apparatus) 18. In the loading/unloading section 14, a moving mechanism 70 is laid along the line of the front loading sections 12, and on the moving mechanism 70 are installed two transfer robots (loaders) 72 movable along the arrangement direction of substrate cassettes. The transfer robots 72, by their movement on the traveling mechanism 70, can reach the substrate cassettes loaded on the front loading sections 12.

The polishing section 16, which is to perform polishing (flattening) of a substrate, includes a first polishing unit 74A, a second polishing unit 74B, a third polishing unit 74C and a fourth polishing unit 74D. The first polishing unit 74A includes a polishing table 78A on which a polishing pad 76, having a polishing surface, is mounted; a top ring 80A for holding a substrate and pressing the substrate against the polishing pad 76 on the polishing table 78A for polishing of the substrate; a polishing liquid supply nozzle 82A for supplying a polishing liquid (e.g., a slurry) or a dressing liquid (e.g., pure water) to the polishing pad 76; a dresser 84A for performing dressing of the polishing surface of the polishing pad 76; and an atomizer 86A for spraying a liquid (e.g., pure water) or a mixed fluid of a liquid (e.g., pure water) and a gas (e.g., nitrogen gas), in the form of a mist, onto the polishing surface.

Similarly, the second polishing unit 74B includes a polishing table 78B on which a polishing pad 76 is mounted, a top ring 80B, a polishing liquid supply nozzle 82B, a dresser 84B, and an atomizer 86B. The third polishing unit 74C includes a polishing table 78C on which a polishing pad 76 is mounted, a top ring 80C, a polishing liquid supply nozzle 82C, a dresser 84C, and an atomizer 86C. The fourth polishing unit 74D includes a polishing table 78D on which a polishing pad 76 is mounted, a top ring 80D, a polishing liquid supply nozzle 82D, a dresser 84D, and an atomizer 86D.

The first polishing unit 74A, the second polishing unit 74B, the third polishing unit 74C and the fourth polishing unit 74D have the same construction, and hence a detailed description will be given below only of the first polishing unit 74A. The polishing pad 76 is attached to the upper surface of the polishing table 78A; the upper surface of the polishing pad 76 constitutes a polishing surface for polishing a substrate. The top ring 80A and the polishing table 78A are configured to rotate on their own axis. A substrate is held on the lower surface of the top ring 80A by vacuum attraction.

During polishing of a substrate, the substrate is pressed by the top ring 80A against the polishing surface of the polishing pad 76 while a polishing liquid is supplied from the polishing liquid supply nozzle 82A to the polishing surface. After the completion of polishing, dressing (conditioning) of the polishing surface with the dresser 84A is performed. Thereafter, a high-pressure fluid is supplied from the atomizer 86A to the polishing surface to remove polishing debris, abrasive particles, etc. remaining on the polishing surface.

A first linear transporter 88 is disposed adjacent to the first polishing unit 74A and the second polishing unit 74B. The first linear transporter 88 is a mechanism for transferring a substrate between four transferring positions (first transferring position TP1, second transferring position TP2, third transferring position TP3 and fourth transferring position TP4). A second linear transporter 90 is disposed adjacent to the third polishing unit 74C and the fourth polishing unit 74D. The second linear transporter 90 is a mechanism for transferring a substrate between three transferring positions (fifth transferring position TP5, sixth transferring position TP6 and seventh transferring position TP7).

A substrate is transferred by the first linear transporter 88 to the polishing units 74A, 74B. The top ring 80A of the first polishing unit 74A, by its swinging motion, moves between a position above the polishing table 78A and the second transferring position TP2. Thus, a substrate is transferred to or from the top ring 80A at the second transferring position TP2. Similarly, the top ring 80B of the second polishing unit 74B moves between a position above the polishing table 78B and the third transferring position TP3; a substrate is transferred to or from the top ring 80B at the third transferring position TP3. The top ring 80C of the third polishing unit 74C moves between a position above the polishing table 78C and the sixth transferring position TP6; a substrate is transferred to or from the top ring 80C at the sixth transferring position TP6. The top ring 80D of the fourth polishing unit 74D moves between a position above the polishing table 78D and the seventh transferring position TP7; a substrate is transferred to or from the top ring 80D at the seventh transferring position TP7.

A lifter 92, for receiving a substrate from the transfer robot 72, is disposed at the first transferring position TP1. A substrate is transferred from the transfer robot 72 to the first linear transporter 88 via the lifter 92. A shutter (not shown) is provided in the partition wall 1a at a position between the lifter 92 and the transfer robot 72. The shutter is opened upon transfer of a substrate so that the substrate is transferred from the transfer robot 72 to the lifter 92.

A swing transporter 94 is disposed between the first linear transporter 88, the second linear transporter 90 and the cleaning section 16. A substrate is transferred from the first linear transporter 88 to the second linear transporter 90 by the swing transporter 94. A substrate after polishing in the polishing section 16 is transferred by the swing transporter 94 to the cleaning section 18.

Figure 9:
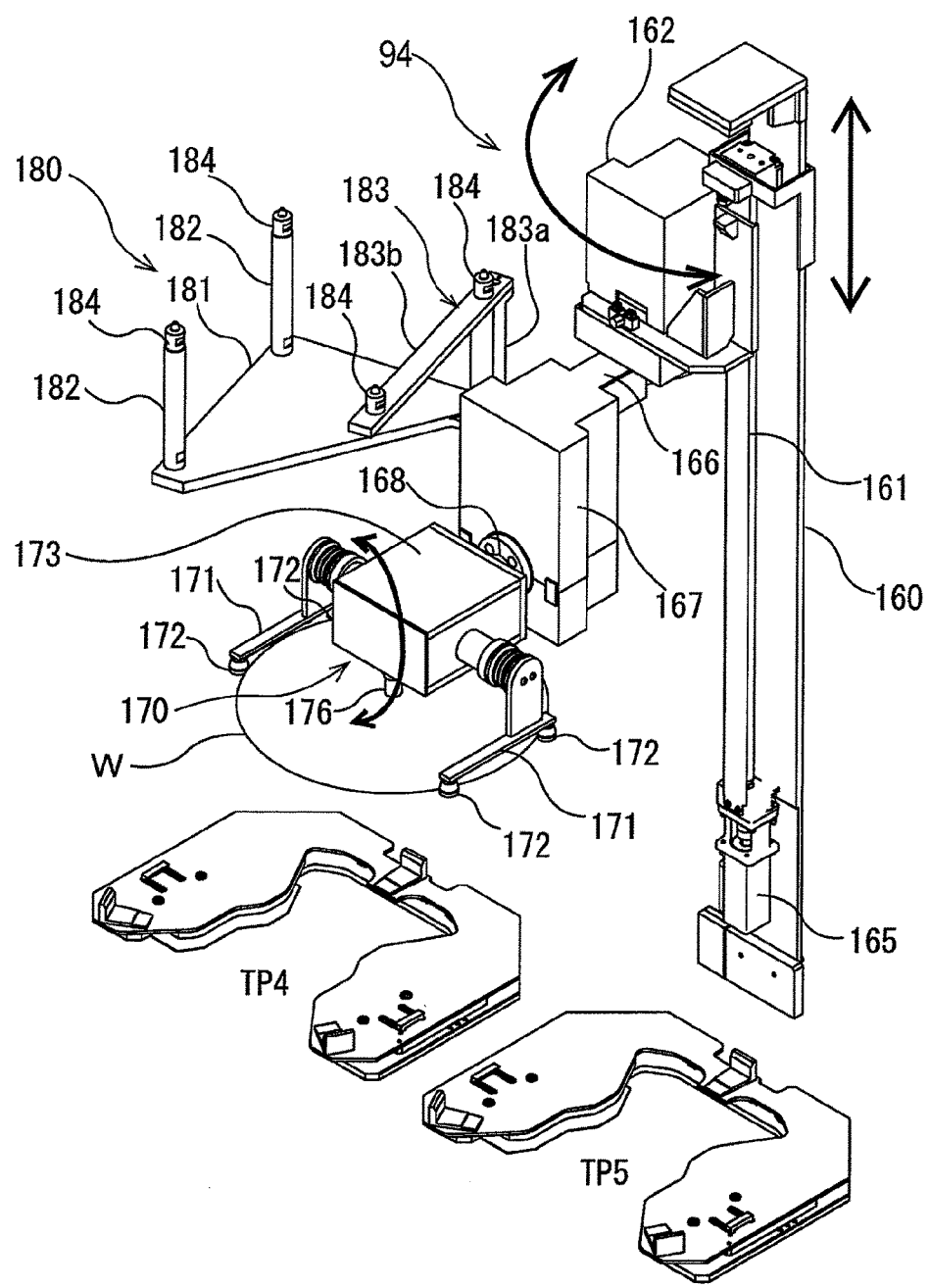
FIG. 9 is a perspective view of a substrate transfer device (swing transporter) according to an embodiment of the present invention, provided in the CMP apparatus shown in FIG. 8.

FIG. 9 is a perspective view showing the structure of the swing transporter 94. The swing transporter 94 is a substrate transfer device according to an embodiment of the present invention. The swing transporter 94 is installed on a frame 160 of the CMP apparatus, and includes a vertically-extending linear guide 161, a swinging mechanism 162 mounted to the linear guide 161, and a lifting drive mechanism 165 for vertically moving the swinging mechanism 162. A Robo cylinder having a servomotor and a ball screw, for example, can be used as the lifting drive mechanism 165.

A reversing mechanism 167 is coupled via a swing arm 166 to the swinging mechanism 162. A gripping mechanism 170 for gripping a substrate W is coupled to the reversing mechanism 167. A temporary holder 180 for a substrate W, installed on a not-shown frame, is disposed beside the swing transporter 94. The temporary holder 180 is disposed adjacent to the first linear transporter 88 and located between the first linear transporter 88 and the cleaning section 18.

By the actuation of a not-shown motor of the swinging mechanism 162, the swing arm 166 swings on the rotating shaft of the motor, whereby the reversing mechanism 167 and the gripping mechanism 170 swing together, and the gripping mechanism 170 moves between the fourth transferring position TP4, the fifth transferring position TP5 and the temporary holder 180.

The gripping mechanism 170 includes a pair of support arms 171 for supporting a substrate W. Each support arm 171 has chucks 172 each for supporting a peripheral end portion of the substrate W. The chucks 172 are located at both ends of each support arm 171 and project downwardly. The substrate W is held by a plurality (e.g., four as illustrated in FIG. 2) of the chucks 172. The gripping mechanism 170 also includes an opening/closing mechanism 173 for moving the pair of support arms 171 away from and closer to the substrate W.

Figure 10:
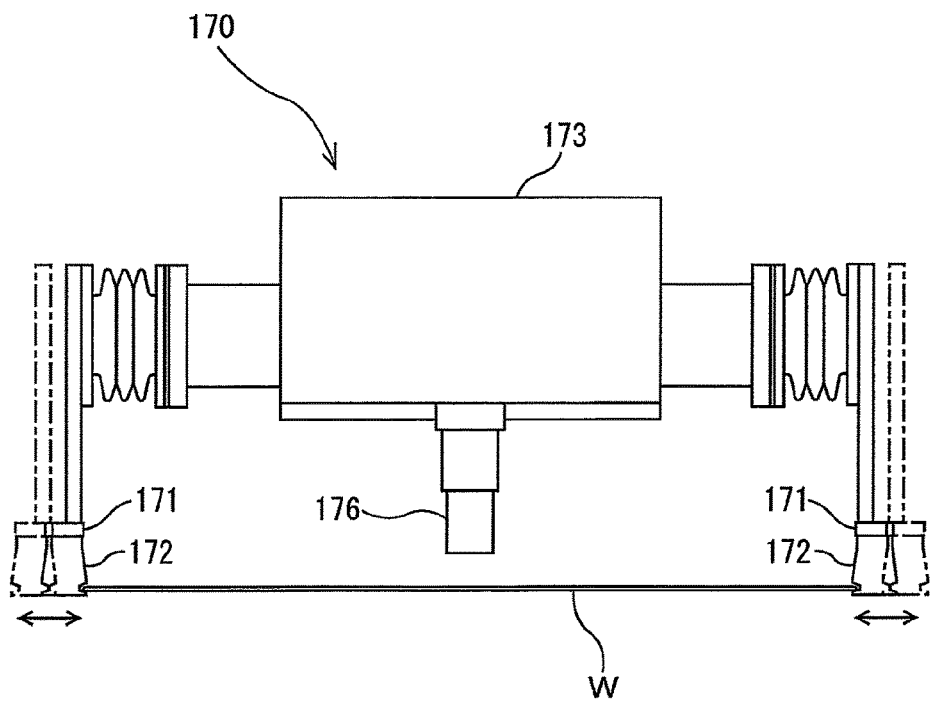
FIG. 10 is a front view of a gripping mechanism of the swing transporter.

FIG. 10 is a front view of the gripping mechanism 170. As shown in FIG. 10, the support arms 171 are coupled to the opening/closing mechanism 173 and, as shown by the arrows in FIG. 10, move away from and closer to each other. The substrate W is held by the chucks 172 of the support arms 171.

Figure 11:
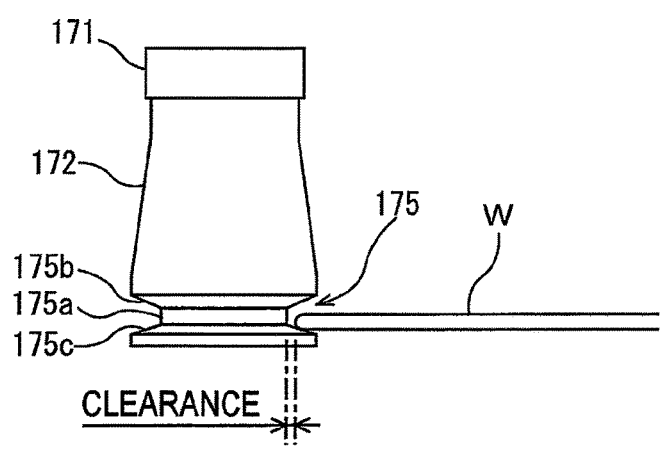
FIG. 11 is an enlarged view of a chuck of a support arm.

FIG. 11 is an enlarged view of the chuck 172 of the support arm 171. The chuck 172 is a cylindrical member and, as shown in FIG. 11, has an annular groove 175 with which a peripheral end portion of the substrate W gently engages. The groove 175 consists of a cylindrical surface 175a, an annular tapered surface 175b extending obliquely upward from the upper end of the cylindrical surface 175a, and an annular tapered surface 175c extending obliquely downward from the lower end of the cylindrical surface 175a. A peripheral end portion of the substrate W is placed on the tapered surface 175c.

When the chuck 172 supports the substrate W, a predetermined clearance is formed between the chuck 172 and the peripheral end portion of the substrate W, i.e., the substrate W is held not tightly but gently by the groove 175 of the chuck 172. Thus, the clearance between the chuck 172 of the support arm 171 and the peripheral end portion of the substrate W is formed in the radial direction of the substrate W, i.e., the clearance is formed between the cylindrical surface 175a, constituting the groove 175, and the peripheral end portion of the substrate W. The clearance is determined by the space (distance) between the two support arms 171 supporting the substrate W. The distance between the support arms 171 is preset in the opening/closing mechanism 173.

A substrate detection sensor 176 is provided under the opening/closing mechanism 173. The substrate detection sensor 176 is configured to detect whether or not a substrate exists between the support arms 171. Upon detection of the absence of a substrate, e.g., due to fall of a substrate during its transportation, by the substrate detection sensor 176, the substrate transfer operation is stopped.

The reversing mechanism 167 has a rotating shaft 168 coupled to the gripping mechanism 170, and a motor (not shown) for rotating the rotating shaft 168. By driving the rotating shaft 168 by the motor, the whole gripping mechanism 170 rotates 180 degrees, thereby reversing a substrate W held by the gripping mechanism 170. The whole gripping mechanism 170 can thus be reversed by the reversing mechanism 167. This makes it possible to eliminate a conventional operation, transfer of a substrate between a gripping mechanism and a reversing mechanism. The reversing mechanism 167 does not reverse a substrate W when the swing transporter 94 transfers a substrate W from the fourth transferring position TP4 to the fifth transferring position TP5, and the substrate W is transferred with the surface to be polished facing downward. On the other hand, when the swing transporter 94 transfers the substrate W from the fourth transferring position TP4 or the fifth transferring position TP5 to the temporary holder 180, the reversing mechanism 167 reverses the substrate W so that the polished surface faces upward.

A substrate W is transferred in the following manner. First, the gripping mechanism 170, with the support arms 171 open, is lowered by the lifting drive mechanism 165 until the groove 175 of each chuck 172 comes to lie in the same plane as the substrate W. The opening/closing mechanism 173 is then driven to move the support arms 171 closer to each other until the chucks 172 of the support arms 171 come to support the periphery of the substrate W with a clearance formed between each chuck 172 and a peripheral end portion of the substrate W. Thereafter, the support arms 171 and the substrate W are raised by the lifting drive mechanism 165, and then swung by the swinging mechanism 162. In this embodiment, the lifting drive mechanism 165 and the swinging mechanism 162 constitute a movement mechanism for moving a substrate W and the support arms 171.

The substrate W may be reversed by the reversing mechanism 167 before swinging the substrate W by the swinging mechanism 162. The upper tapered surface 175b and the lower tapered surface 175c of each groove 175 have symmetrical shapes and, when the substrate W is reversed, a peripheral end portion of the substrate W is supported on the tapered surface 175b. Because the periphery of the substrate W is inserted into the grooves 175 of the chucks 172, the substrate W, when reversed, will not fall from the chucks 172. Therefore, the swing transporter 94 can perform the operations of gripping, reversing and transferring the substrate W in a successive manner.

The temporary holder 180 includes a base plate 181, a plurality (e.g., two as illustrated in FIG. 9) of vertical rods 182 secured to the upper surface of the base plate 181, and an inverted L-shaped horizontal rod 183 secured to the upper surface of the base plate 181. The horizontal rod 183 includes a vertical portion 183a connected to the upper surface of the base plate 181, and a horizontal portion 183b horizontally extending toward the gripping mechanism 170 from the upper end of the vertical portion 183a. The horizontal portion 183b has, on its upper surface, a plurality (e.g., two as illustrated in FIG. 9) of pins 184 for supporting a substrate W. The vertical rods 182 each have, at the upper end, a pin 184 for supporting a substrate W. The front ends of the pins 184 lie in the same horizontal plane. The horizontal rod 183 is located closer than the vertical rods 182 to the center of swinging movement of a substrate W (i.e., the rotating shaft of the motor of the swinging mechanism 162).

The gripping mechanism 170, holding the substrate W and which has been reversed by the reversing mechanism 167, is moved by the swinging mechanism 162 toward the temporary holder 180. The opening/closing mechanism 173 enters the space between the horizontal portion 183b of the horizontal rod 183 and the base plate 181, and the substrate W and the support arms 171 move above the pins 184. The swinging movement of the gripping mechanism 170 by the swinging mechanism 162 is stopped when all the pins 184 have come to lie beneath the substrate W. The gripping mechanism 170 is then lowered and the support arms 171 are opened, thereby placing the substrate W on the pins 184 of the temporary holder 180.

Figure 12:
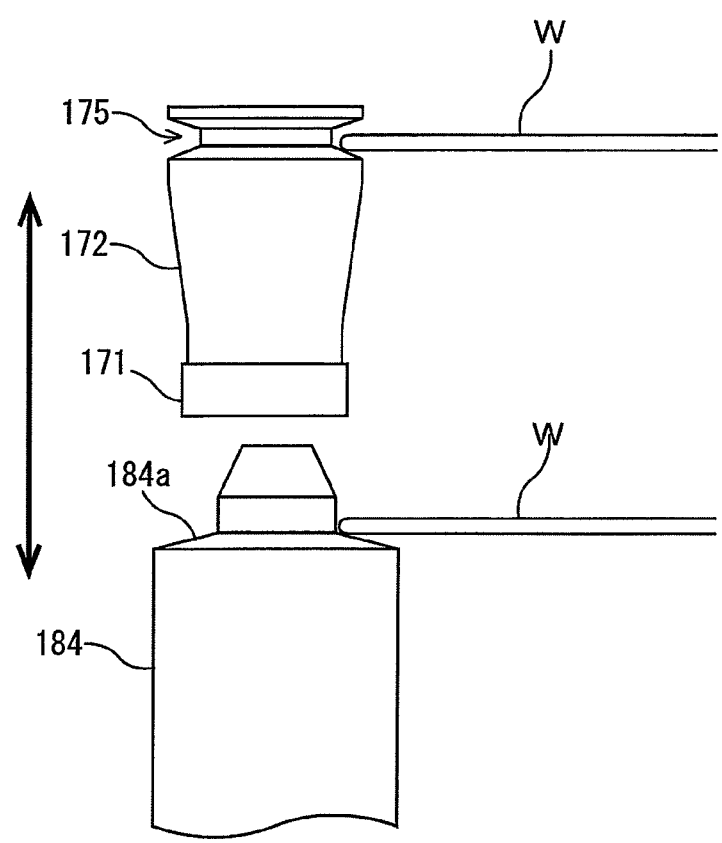
FIG. 12 is an enlarged view of the chuck of the support arm and a pin of a temporary holder.

FIG. 12 is an enlarged view of the chuck 172 of the support arm 171 and the pin 184 of the temporary holder 180. FIG. 12 shows the chuck 172 and the substrate W which have been reversed by the reversing mechanism 167. As shown in FIG. 12, each pin 184 has at the upper end a downwardly tapered surface 184a. The substrate W, which has been transferred by the swing transporter 94 to the temporary holder 180, is placed on the tapered surfaces 184a of the pins 184.

As described above, a clearance is provided between each chuck 172 and a peripheral end portion of the substrate W. The clearance permits lateral movement of the substrate W when the substrate W is placed on the pins 184 of the temporary holder 180. Therefore, the substrate W and the temporary holder 180 will not strongly rub together even when there is an error in positioning or a later displacement between the swing transporter 94 and the temporary holder 180. This can prevent damage to the substrate W, the generation of particles from the substrate W, a failure in transfer of the substrate W, etc.

The clearance provided between each chuck 172 and the substrate W can also achieve the following advantageous effect. As shown in FIG. 8, the substrate W is transferred in the following order: the fourth transferring position TP4 or the fifth transferring position TP5, the swing transporter 94, and the temporary holder 180. If no clearance is provided between each chuck 172 of the support arm 171 and the substrate W, positioning between the swing transporter 94 and the temporary holder 180 becomes difficult because of an error in positioning between the transferring position TP4 or TP5 and the swing transporter 94. According to the above-described embodiment, the clearance provided between each chuck 172 and the substrate W can absorb the positioning error, making it possible to easily make an adjustment in positioning between the swing transporter 94 and the temporary holder 180.

The substrate W placed on the temporary holder 180 is transferred by the first transfer robot 46, disposed in the first transfer area 36 of the cleaning section 18, to one of the first cleaning units 40a, 40b disposed in the first cleaning area 30 of the cleaning section 18, where the substrate W is cleaned (primary cleaning). Thereafter, the substrate W is transferred by the first transfer robot 46, disposed in the first transfer area 36, to one of the second cleaning units 42a, 42b disposed in the second cleaning area 32, where the substrate W is cleaned (secondary cleaning). Thereafter, the substrate W is transferred by the second transfer robot 48, disposed in the second transfer area 38, to one of the third cleaning units 44a, 44b disposed in the third cleaning area 34, where the substrate W is cleaned (rinsing and drying).

The dried substrate W is taken by the transfer robot 72 out of the one of the third cleaning units 44a, 44b, and returned to the substrate cassette. The sequence of process steps, including polishing, cleaning and drying, is carried out for a substrate in the above-described manner.

While the present invention has been described with reference to preferred embodiments, it is understood that the present invention is not limited to the embodiments described above, but is capable of various changes and modifications within the scope of the inventive concept as expressed herein.

What is claimed is:
1. A substrate processing apparatus for processing a substrate comprising:
    a housing having an interior which is divided by partition walls into sections;
    a first processing area which has been subjected to light shielding processing, the first processing area being located in one of the sections of the housing;

a second processing area which has been subjected to light shielding processing, the second processing area being located in the one of the sections of the housing;

a transfer area which has been subjected to light shielding processing, the transfer area being located in the one of the sections of the housing and being located between the first processing area and the second processing area;

a first light shielding wall provided between the first processing area and the transfer area, the first light shielding wall having a plurality of first openings through which the substrate is transferred;

a plurality of processing units vertically arranged in the first processing area, each of the processing units having been subjected to light shielding processing, and each of the processing units being configured to include a box-like housing composed of a light shielding material, the box-like housing being configured to house a processing machine, wherein a substrate insertion opening is formed in a sidewall of the box-like housing; the substrate insertion opening is provided in a position facing a respective first opening of the first light shielding wall; and the box-like housing is coupled to the first light shielding wall in a light shielding state;

a second light shielding wall provided between the second processing area and the transfer area, the second light shielding wall having a plurality of second openings through which the substrate is transferred;

a plurality of processing units vertically arranged in the second processing area, each of the processing units having been subjected to light shielding processing, and each of the processing units being configured to include a box-like housing composed of a light shielding material, the box-like housing being configured to house a processing machine, wherein a substrate insertion opening is formed in a sidewall of the box-like housing; the substrate insertion opening is provided in a position facing a respective second opening of the second light shielding wall; and the box-like housing is coupled to the second light shielding wall in a light shielding state; and a plurality of maintenance doors provided in the housing and configured to be open for performing maintenance of the first processing area, the second processing area, or the transfer area, the maintenance doors being made of a light shielding member;

wherein the transfer area has a transfer robot to transfer the substrate from any of the plurality of processing units of the first processing area or the plurality of processing units of the second processing area to the transfer area; and wherein each of the first light shielding wall, the second light shielding wall, the plurality of processing units in the first processing area and the plurality of processing units in the second processing area are configured such that, in a state in which one of the maintenance doors is open for performing maintenance of one of the plurality of processing units in the first processing area or one of the plurality of processing units in the second processing area, external light is prevented from entering the other processing units and the transfer area;

wherein, for each of the plurality of processing units in the first processing area, the substrate insertion opening is provided with an openable/closable shutter; and a light shielding film is mounted to the sidewall of the housing of the processing unit surrounding a periphery of the substrate insertion opening, and is coupled to the first light shielding wall; and wherein, for each of the plurality of processing units in the second processing area, the substrate insertion opening is provided with an openable/closable shutter; and a light shielding film is mounted to the sidewall of the housing of the processing unit surrounding a periphery of the substrate insertion opening, and is coupled to the second light shielding wall.

2. The substrate processing apparatus for processing a substrate according to claim 1, wherein, for each of the plurality of processing units in the first processing area and each of the plurality of processing units in the second processing area, the substrate insertion opening is provided on a transfer area-facing side of the processing unit.

3. The substrate processing apparatus for processing a substrate according to claim 1, wherein the first processing area and the second processing area are cleaning areas, and the substrate processing apparatus is a substrate cleaning apparatus.

4. The substrate processing apparatus for processing a substrate according to claim 1, wherein the substrate processing apparatus is a chemical mechanical polishing apparatus.

5. The substrate processing apparatus for processing a substrate according to claim 1, wherein, for each of the plurality of processing units in the first processing area and each of the plurality of processing units in the second processing area, the light shielding film is in the shape of a rectangular frame.

6. The substrate processing apparatus for processing a substrate according to claim 1, wherein the substrate processing apparatus is configured to process the substrate having a copper film.

7. The substrate processing apparatus for processing a substrate according to claim 1,
wherein, for each of the plurality of processing units in the first processing area, the light shielding film is mounted to the first light shielding wall at a position surrounding a periphery of the opening of the first light shielding wall; and
wherein, for each of the plurality of processing units in the second processing area, the light shielding film is mounted to the second light shielding wall at a position surrounding a periphery of the opening of the second light shielding wall.

8. The substrate processing apparatus for processing a substrate according to claim 1, wherein, for each of the plurality of processing units in the first processing area and each of the plurality of processing units in the second processing area, the openable/closable shutter is provided on an interior of the box-like housing.

9. The substrate processing apparatus for processing a substrate according to claim 1, wherein, for each of the plurality of processing units in the first processing area and each of the plurality of processing units in the second processing area, the openable/closable shutter is configured to be closed in the state in which the one of the maintenance doors is open for performing maintenance of one of the plurality of processing units in the first processing area or one of the plurality of processing units in the second processing area.

* * * * *